(12) United States Patent
Sakaguchi et al.

(10) Patent No.: US 8,344,603 B2
(45) Date of Patent: Jan. 1, 2013

(54) ORGANIC ELECTROLUMINESCENCE DISPLAY APPARATUS

(75) Inventors: Kiyofumi Sakaguchi, Mobara (JP); Noa Sumida, Chiba (JP); Kohei Nagayama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 12 days.

(21) Appl. No.: 13/197,929

(22) Filed: Aug. 4, 2011

(65) Prior Publication Data

US 2012/0032590 A1    Feb. 9, 2012

(30) Foreign Application Priority Data

Aug. 9, 2010  (JP) .................. 2010-178320
Jun. 20, 2011  (JP) .................. 2011-136084

(51) Int. Cl.
*H01J 5/16* (2006.01)
(52) U.S. Cl. .......... 313/110; 257/98; 313/498; 313/501; 313/111

(58) Field of Classification Search ............ 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82, 455; 445/24–25; 359/362; 362/326, 335
See application file for complete search history.

(56) References Cited

U.S. PATENT DOCUMENTS

2009/0079336 A1    3/2009 Yamada et al.

FOREIGN PATENT DOCUMENTS

| JP | 2004-039500 A | 2/2004 |
| JP | 2004-205849 A | 7/2004 |

*Primary Examiner* — Mariceli Santiago
*Assistant Examiner* — Donald Raleigh
(74) *Attorney, Agent, or Firm* — Canon U.S.A., Inc. IP Division

(57) ABSTRACT

An organic EL display apparatus includes a plurality of pixels and a lens array which includes a light-condensing lens portion and a flat portion disposed on the light-emitting surface side of each pixel. Each pixel includes a light-emitting layer contained between a pair of electrodes. Part of the light emitted from the light-emitting layer is condensed by the light-condensing lens portion. A top surface of the light-condensing lens portion overlies the light-emitting region, and a part of the light-condensing lens portion is located outside the light-emitting region.

8 Claims, 9 Drawing Sheets

ORGANIC ELECTROLUMINESCENCE DISPLAY APPARATUS

BACKGROUND OF THE INVENTION

1. Field of the Invention

The present invention relates to a display apparatus using an organic electroluminescence (EL) device (an organic light-emitting diode (OLED)), and more particularly, relates to a display apparatus using an organic EL device that can improve light utilization efficiency in the front direction.

2. Description of the Related Art

One problem concerning organic EL devices is that the light emission efficiency is low. In order to improve the luminance of an organic EL device, usually, it is necessary to take measures, such as increasing the luminous efficiency itself or passing a larger electrical current through the device. However, in the former, it is technically difficult to immediately improve the luminance, and there is a problem with the latter that the power consumption increases and degradation accelerates.

On the other hand, as measures to improve the luminance of an organic EL device while maintaining low driving current, a technique is known in which a convex lens is placed on the light extraction side so as to condense light, thereby improving the utilization efficiency of emitted light. Japanese Patent Laid-Open No. 2004-39500 discloses a structure in which a lens array composed of a resin is disposed on a silicon oxynitride ($SiN_xO_y$) layer that seals an organic EL device so that light collection efficiency in the direction of illumination can be improved.

In the organic EL device according to Japanese Patent Laid-Open No. 2004-39500, by condensing emitted light, light emitted in oblique directions is condensed in the front direction, and therefore, the luminance in the front direction is improved. However, the luminance in oblique directions is significantly decreased, resulting in a degradation in radiation angle characteristics, which is a problem.

SUMMARY OF THE INVENTION

The present invention provides an organic EL display apparatus in which light utilization efficiency is improved while maintaining radiation angle characteristics.

According to the present invention, an organic electroluminescence display apparatus includes a plurality of organic electroluminescence devices and a lens array which includes a light-condensing lens portion for each organic electroluminescence device. A region in which the light-condensing lens portion is disposed and a region in which the light-condensing lens portion is not disposed are located on a light-emitting region of each organic electroluminescence device. A top surface of the light-condensing lens portion overlies the light-emitting region, and a part of the light-condensing lens portion is located outside the light-emitting region.

According to the present invention, since the light-condensing lens portion is disposed on part of the organic EL device, part of the emitted light can be condensed, and the remainder of the emitted light can be emitted directly. Consequently, it is possible to provide a display apparatus having a high front luminance while maintaining radiation angle characteristics in an oblique field of view.

Further features of the present invention will become apparent from the following description of exemplary embodiments with reference to the attached drawings.

DESCRIPTION OF THE EMBODIMENTS

Figure 1A:
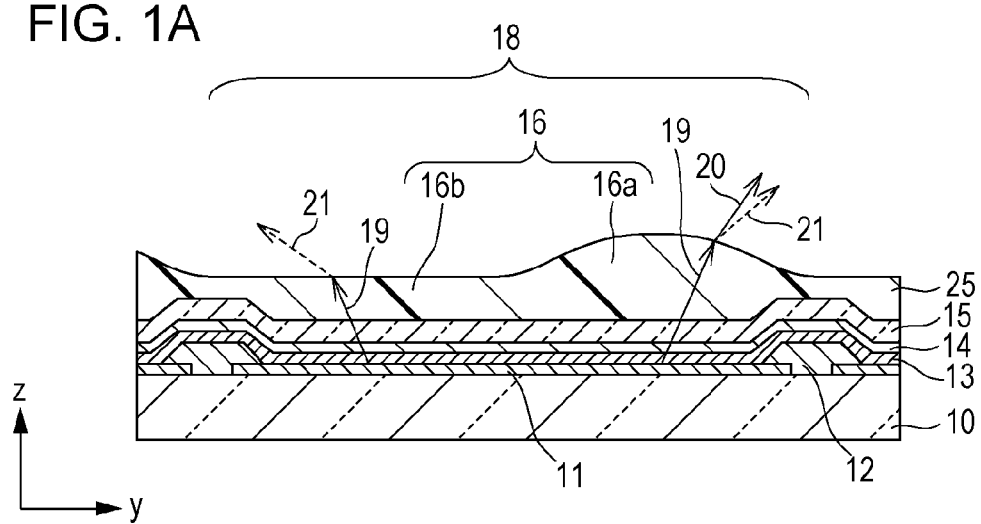
FIG. 1A is a cross-sectional schematic view showing a structure of a pixel in an organic EL display apparatus according to an embodiment of the present invention.

An organic electroluminescence display apparatus (organic EL display apparatus) according to the present invention includes a plurality of organic electroluminescence devices (organic EL devices) disposed on a substrate, and a lens array. Each of the organic EL devices includes a pair of electrodes and an organic compound layer including at least a light-emitting layer sandwiched between the electrodes. The lens array includes at least a light-condensing lens portion for each organic EL device; and the light-condensing lens portion is disposed so as to correspond to part of the region of the organic EL device. That is, a region in which the light-condensing lens portion is disposed and a region in which the light-condensing lens portion is not disposed are located on the light-emitting region of each organic EL device. The region in which the light-condensing lens portion is not disposed has a flat surface, and hereinafter, this region may be referred to as a flat portion. That is, in the organic EL display apparatus according to the present invention, part of the emitted light passes through the light-condensing lens portion and the remainder of the emitted light is output without passing through the light-condensing lens portion.

Furthermore, the light-condensing lens portion has a structure in which, when viewed from the observer side, the top of the light-condensing lens portion overlies the light-emitting region, and part of the light-condensing lens portion is located outside the light-emitting region. Because of this structure, the light-condensing performance of the light-condensing lens portion is improved. Note that the term "top" refers to a point on the surface of the light-condensing lens portion at which the length of a perpendicular line from the surface of the light-condensing lens portion on the light output side to the light-emitting region of the organic EL device is largest. In other words, the top refers to a point on the surface of the light-condensing lens portion at which the distance from the electrode located on the light emission side of the organic EL device to the surface of the light-condensing lens portion on the light emission side is largest. Note that the expression "part of the light-condensing lens portion is located outside the light-emitting region of the organic EL device" means, in other words, that the lens diameter of the light-condensing lens portion is larger than the width of the short side of the light-emitting region of the organic EL device.

Note that the term "light-emitting surface side of the organic EL device" means the side of the organic EL device from which light emission is extracted. In the organic EL display apparatus, display signals corresponding to gray level are applied to the organic EL devices, and the smallest unit to which the same display signal is applied corresponds to one pixel. Usually, by combining certain patterns of red (R) color, green (G) color and blue (B) color, full-color display is performed. Thus, an organic EL device is provided with a light-emitting layer that emits one of R, G, and B colors. Consequently, a pixel, which is the unit of display, is the smallest unit to which a display signal that displays one of R color, G color, and B color is applied. A given hue (gradation of color) is displayed by combining signals from a group of three pixels including an R pixel that displays R color, a G pixel that displays G color, and a B pixel that displays B color.

An organic EL display apparatus according to an embodiment of the present invention will be described below.

FIG. 1A is a partial cross-sectional view showing a section corresponding to one pixel of an organic EL display apparatus according to the embodiment of the present invention. A pixel 18 is constituted by one organic EL device. The organic EL device 18 includes an organic compound layer 13 including a light-emitting layer sandwiched between a pair of electrodes 11 and 14. Specifically, the organic EL device includes the first electrode 11 disposed on a substrate 10, the organic compound layer 13 disposed on the first electrode 11, and the second electrode 14 disposed on the organic compound layer 13. Adjacent individual organic EL devices are isolated (separated from each other) by a partition (or bank) 12, and the aperture (light-emitting region) of each organic EL device is defined by (or contained within) consecutive partitions 12.

In FIG. 1A, the organic compound layer 13 is a single layer or a laminated body composed of a plurality of layers including a light-emitting layer. For example, the organic compound layer 13 has a four-layered structure including a hole transport layer, a light-emitting layer, an electron transport layer, and an electron injection layer, or a three-layered structure including a hole transport layer, a light-emitting layer, and an electron transport layer. As materials (an organic luminescent material, a hole-transporting material, an electron-transporting material, an electron-injecting material, and the like) constituting the organic compound layer 13, known materials can be used. Furthermore, by forming light-emitting layers using a red light-emitting material, a green light-emitting material, or a blue light-emitting material, color display can be performed.

The first electrode 11 is disposed in each organic EL device in the in-plane direction of the substrate on the substrate 10, and the second electrode 14 is continuously disposed so as to be common to a plurality of organic EL devices. Regarding the organic compound layer 13, the structure of the light-emitting layer differs for each luminescent color. Therefore, in the case where adjacent organic EL devices have the same luminescent color, the light-emitting layer is formed commonly to the adjacent organic EL devices. The layers other than the light-emitting layer are formed commonly to all the organic EL devices. For example, as will be described later, in the case where R pixels, G pixels, and B pixels are each arranged in a stripe pattern in one direction, the light-emitting layers are formed along the stripes. Furthermore, in the arrangement in which adjacent organic EL devices have different luminescent colors, a light-emitting layer is formed for each device.

Furthermore, a drive circuit (not shown) including driving electronics (described in more detail below) and configured to actively drive the organic EL devices is provided on the substrate 10. A protective film 15 is provided on the second electrode 14. The protective film 15 is optically transparent and can be composed of an inorganic material, such as SiO or SiN, or an organic material, such as a thermosetting resin or a photocurable resin.

The organic EL device shown in FIG. 1A is a top emission-type device in which light emission is extracted from the upper surface side of the substrate 10. The first electrode 11 can be composed of an electrode material that reflects light, and the second electrode 14 can be composed of an optically transparent or semi-transmissive electrode material. Note that the present invention can also be applied to a bottom emission-type organic EL device in which light emission is extracted from the back surface of the substrate 10. In this case, the first electrode 11 is an optically transparent or semi-transmissive electrode, and the second electrode 14 is a reflecting electrode. A lens array 16 is formed on the substrate 10 side.

In this embodiment, a lens array 16 includes a light-condensing lens portion 16a disposed on a resin layer 25 and a flat portion 16b for each organic EL device, i.e., for each pixel 18, the light-condensing lens portion 16a condensing light emitted from the organic EL device. The lens array used in the present embodiment includes at least the light-condensing lens portion 16a and the flat portion 16b shown in FIG. 1A. The light-condensing lens portion 16a is formed in part of the region of the organic EL device such that, when viewed from the observer side, the top region of the light-condensing lens portion 16a overlies the light-emitting region, and a part (ex., at least a part of an outer periphery) of the light-condensing lens portion 16a is located outside the light-emitting region. When viewed from above, the area of the light-condensing lens portion 16a that is located outside the light emitting region occupies preferably 40% to 95%, more preferably 50% to 95%, and most preferably 60% to 95%, of the area of the light-condensing lens portion 16a.

In the present invention, the expression "the light-condensing lens portion 16a is formed in part of the region of the organic EL device" means that the light-condensing lens portion 16a is formed in part of a region where light emitted from the light-emitting layer of the organic EL device can be condensed. When referring to "a part (an outer periphery) of the light-condensing lens portion 16a is located outside the light-emitting region", it is intended to mean that the light-condensing lens portion 16a is larger (in at least one direction) than the light-emitting region.

The lens array according to the present invention can be formed using a transparent thermosetting resin, a photocurable resin, or a thermoplastic resin. As described above, the resin for the lens may not remain in the flat portion. In the case where the lens array is formed by photolithography, only light-condensing lens portions are formed, and the resin other than the light-condensing lens portions is removed. Thereby, a lens array without a flat portion is obtained. In the case where a mold is used, flat portions are also formed together with light-condensing lens portions.

Figure 2:
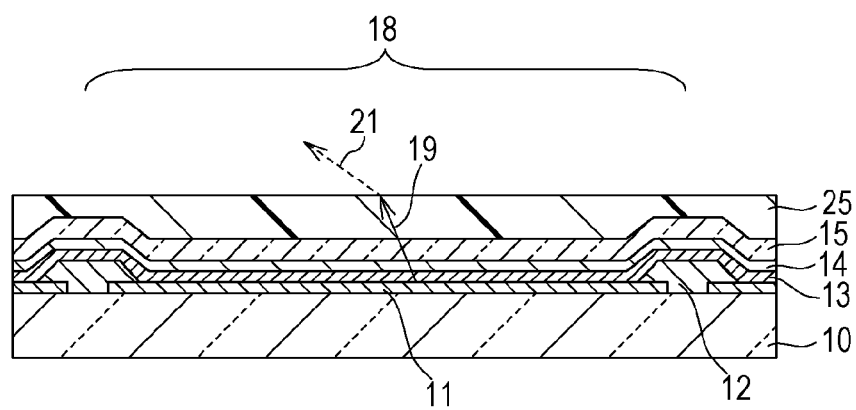
FIG. 2 is a cross-sectional schematic view showing a pixel structure of an example of a known organic EL display apparatus.

FIG. 2 is a partial cross-sectional view showing a section corresponding to one pixel in an example of a known organic EL display apparatus. This organic EL display apparatus differs from the organic EL display apparatus of the present invention shown in FIG. 1A in that the light-condensing lens portion 16a of the lens array 16 is not formed on the resin layer 25 and the entire surface is flat as in the flat portion 16b. In the present invention, as shown in FIG. 1A, light emitted from the organic compound layer 13 passes through the transparent second electrode 14, then passes through the protective film 15, the light-condensing lens portion 16a or the flat portion 16b, and is emitted out of the organic EL display apparatus. In the case where the light-condensing lens portion 16a is not provided, as shown in FIG. 2, light 19 emitted in an oblique direction, which is a portion of light emitted from the light-emitting layer, is emitted from the outermost layer in a more oblique direction (the direction indicated by reference numeral 21). In contrast, in the case where light is emitted through the light-condensing lens portion 16, the emission angle (the direction indicated by reference numeral 20) is closer to the direction perpendicular to the substrate than that in the case of FIG. 2. Consequently, by disposing the light-condensing lens portion 16a, the function of condensing light in the perpendicular direction is obtained. That is, it is possible to improve light utilization efficiency in the front direction with respect to the organic EL display apparatus.

In the present embodiment, the lens array 16 includes the flat portion 16b as in the known organic EL display apparatus and the light-condensing lens portion 16a. Consequently, only part of the emitted light from the light-emitting layer is condensed in the perpendicular direction by the light-condensing lens portion 16a, and the remainder of the emitted light is emitted from the flat portion 16b without being condensed. Therefore, radiation angle characteristics can be maintained.

Note that the degree of light condensation depends on the arrangement position of the lens (position in the x-y plane shown in FIG. 1B) with respect to the light-emitting surface, the curvature of the lens, the distance from the light-emitting surface to the lens (in the z-axis direction shown in FIG. 1A), and the light emission area. (Effect of lens array having flat portions and light-condensing lens portions)

Figure 3:
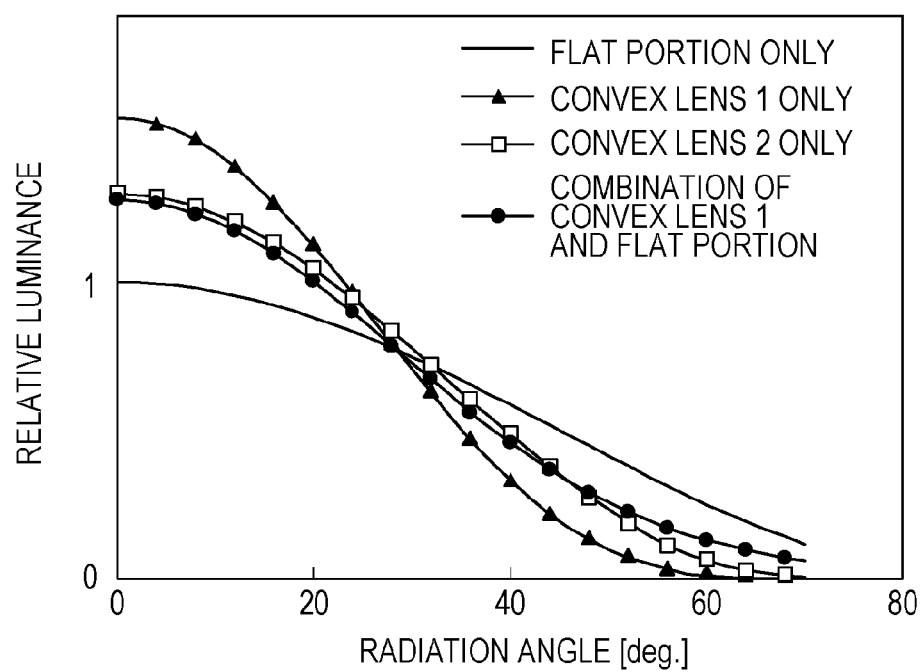
FIG. 3 is a graph showing the effect of the lens array in an organic EL display apparatus according to the present invention.

FIG. 3 is a graph showing the correlation between the radiation angle and the relative luminance in the case where a flat portion only is provided as shown in FIG. 2, in the case where one convex lens is provided for each pixel (no flat portion is provided, and the lens covers the entire region of the EL device), and in the case where a lens array includes a light-condensing lens portion and a flat portion for each pixel as shown in FIG. 1A. The relative luminance refers to a relative luminance in the case where the radiation angle varies or light-condensing lens portions are present, when the luminance at a radiation angle of 0° in a structure in which no light-condensing lens portion is present is assumed as basis 1.

Furthermore, convex lenses 1 and 2 have different radii of curvature, and the relationship R1<R2 is satisfied, where R1 is the radius of curvature of the convex lens 1 and R2 is the radius of curvature of the convex lens 2. In FIG. 3, the radius of curvature R2 of the convex lens 2 is set so as to obtain a luminance substantially equal to the front luminance of a display apparatus having a lens array including light-condensing lens portions having the radius of curvature of the convex lens 1 and flat portions.

As it can be appreciated from FIG. 3, in the case where the lens array including light-condensing lens portions and flat portions is present (solid line with black circles), compared with the case where the flat portion only is present (solid line), at a radiation angle of 30° or less, the relative luminance is high, and at a radiation angle of 30° or more, the relative luminance is low. Furthermore, in the case where the lens array including light-condensing lens portions and flat portions is present, compared with the convex lens 2 (solid line with white squares), at a radiation angle of 50° or less, the relative luminance is substantially the same, and at a radiation angle 50° or more, the relative luminance is high. That is, it is evident that in the case where the lens array according to the present invention is present, the front luminance can be improved by the light-condensing lens portion, and radiation angle characteristics can be maintained by providing the flat portion. In the above description, the boundary at which the correlation between the radiation angle and the relative luminance is changed is the radiation angle 30° or 50°, but the boundary in terms of the radiation angle varies in accordance with the light emission area and the distance from the light-emitting surface to the lens. However, the correlation between the radiation angle and the relative luminance due to the presence or absence of the lenses or the degree of curvature described above does not vary. (Arrangement relationship between light-condensing lens portion and light-emitting region, size, and shape)

Figure 1B:
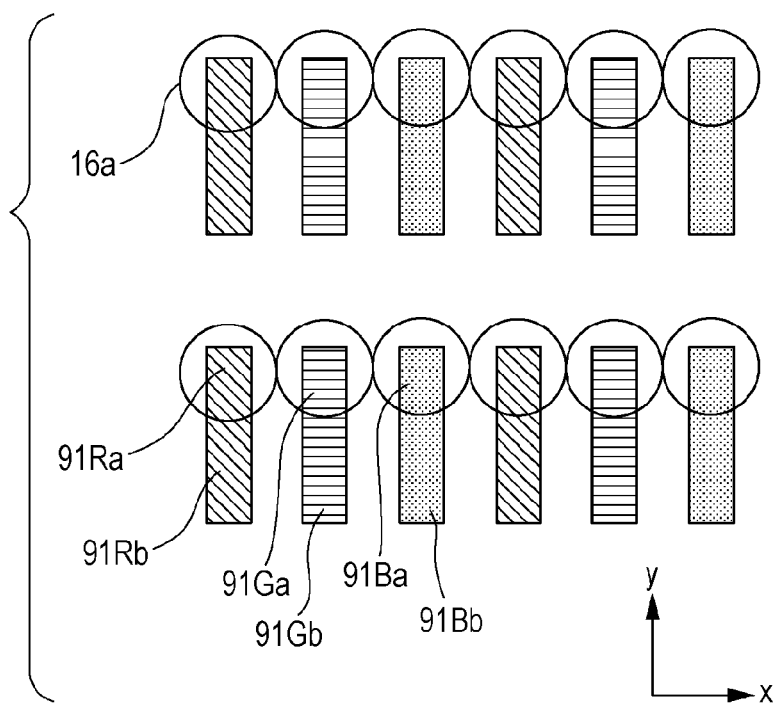
FIG. 1B is a top schematic view of the organic EL display apparatus shown in FIG. 1A.
Figure 4A:
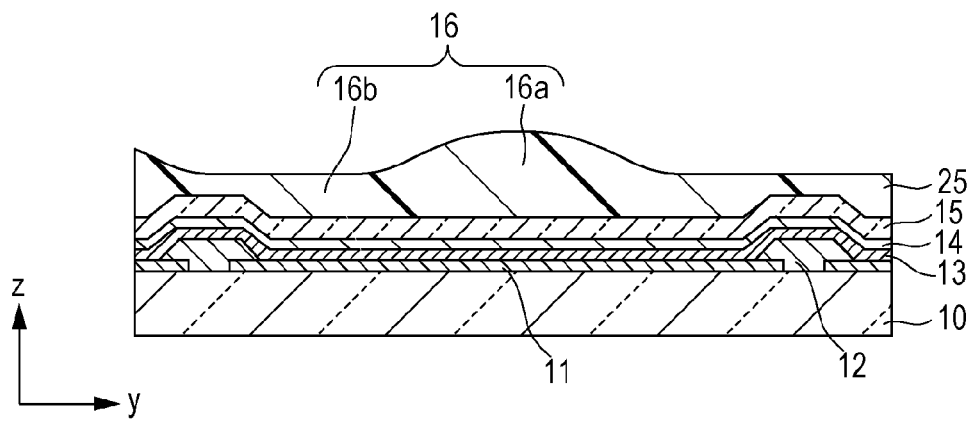
FIG. 4A is a cross-sectional schematic view showing a structure of a pixel in an organic EL display apparatus according to an embodiment of the present invention.
Figure 4B:
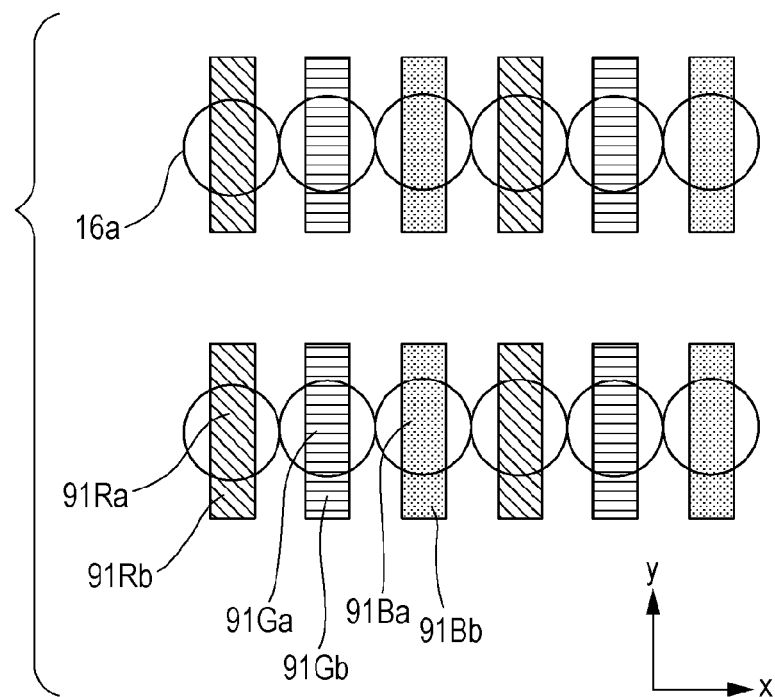
FIG. 4B is a top schematic view of the organic EL display apparatus shown in FIG. 4A.

The advantage due to the fact that, when viewed from the observer side, the top region of the light-condensing lens portion 16a overlies the light-emitting region, and part of the light-condensing lens portion 16a is located outside the light-emitting region, will be described below. FIGS. 1A and 1B and FIGS. 4A and 4B show arrangements of lenses in organic EL display apparatuses according to embodiments of the present invention. FIGS. 1A and 4A are cross-sectional schematic views (y-z plane), and FIGS. 1B and 4B are top schematic views (x-y plane). FIGS. 1A and 1B show the case where a lens portion 16a is located at the end of a light-emitting region of a pixel. FIGS. 4A and 4B show the case where a light-condensing lens portion 16a is located in the middle of the light-emitting region of the pixel. In either case, the lens portion 16a is disposed only on part of the light-emitting region of each pixel.

Figure 5A:
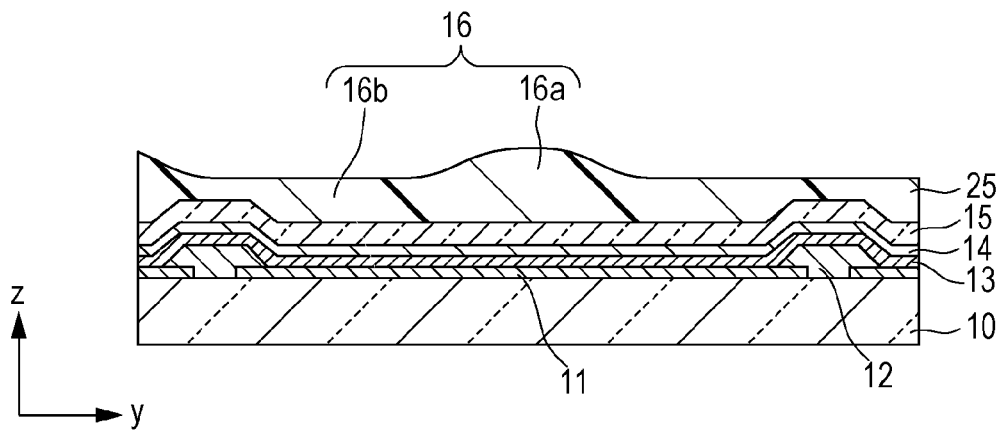
FIG. 5A is a cross-sectional schematic view showing a structure of a pixel in an organic EL display apparatus according to a comparative embodiment used for explaining the effect of the organic EL display apparatus according to the present invention.
Figure 5B:
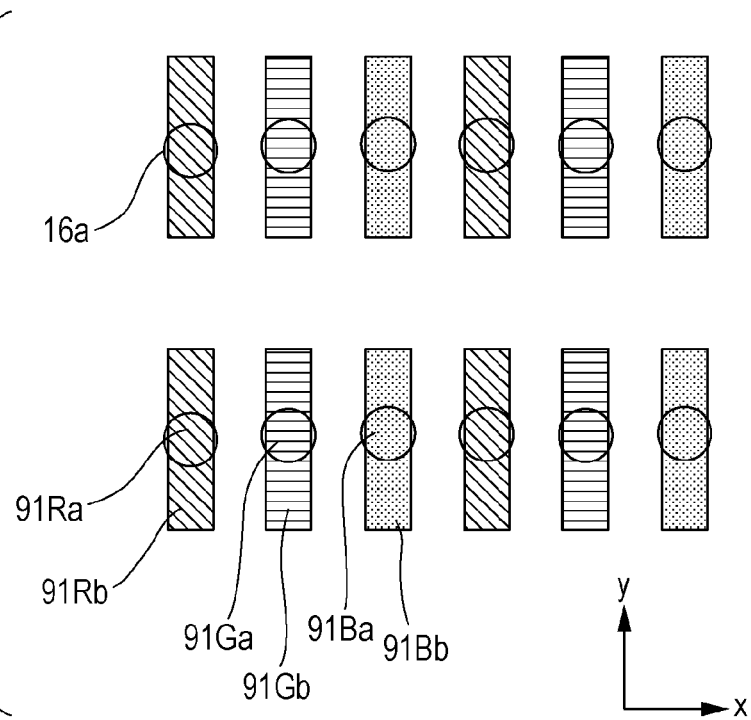
FIG. 5B is a top schematic view of the organic EL display apparatus shown in FIG. 5A.
Figure 6A:
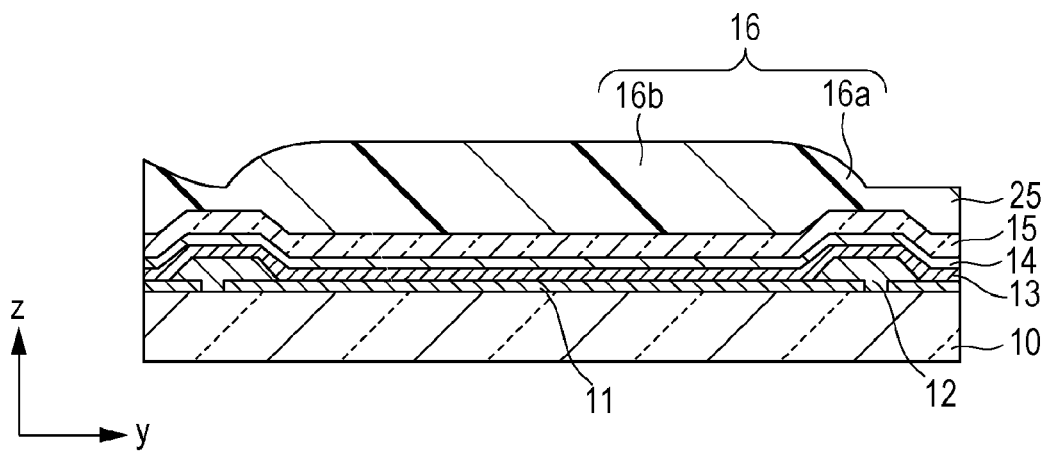
FIG. 6A is a cross-sectional schematic view showing a structure of a pixel in an organic EL display apparatus according to a comparative embodiment used for explaining the effect of the organic EL display apparatus according to the present invention.
Figure 6B:
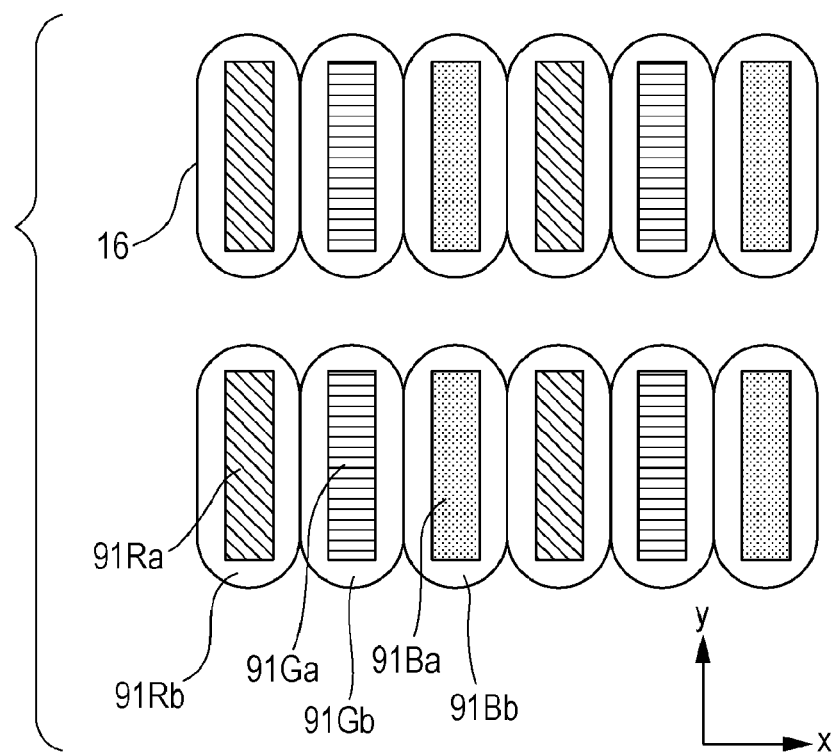
FIG. 6B is a top schematic view of the organic EL display apparatus shown in FIG. 6A.

FIGS. 5A and 5B and FIGS. 6A and 6B show arrangements of lenses which do not satisfy the conditions described above. FIGS. 5A and 6A are cross-sectional schematic views (y-z plane), and FIGS. 5B and 6B are top schematic views (x-y plane). FIGS. 5A and 5B show the case where a whole lens is contained within a light-emitting region of the pixel, that is, the lens having an aperture (diameter) with the same size as the short side of the light-emitting region is located in the center of the pixel. This means that the size of the lens has been decreased to meet the size of the light emitting region in the x-direction in FIG. 5B. FIGS. 6A and 6B show the case where a curved portion is provided in the periphery of a flat portion, and the curved portion serves as a light-condensing lens portion 16a having light-condensing performance. In this case, the lens array 16 is arranged so as to cover pixels, the largest height of the lens corresponds to the height of the flat portion, and the region of the flat portion is larger than the light-emitting region. Although not shown in the drawing, in the x-z cross-section, the region of the flat portion 16b is also larger than the light-emitting region.

Figure 7:
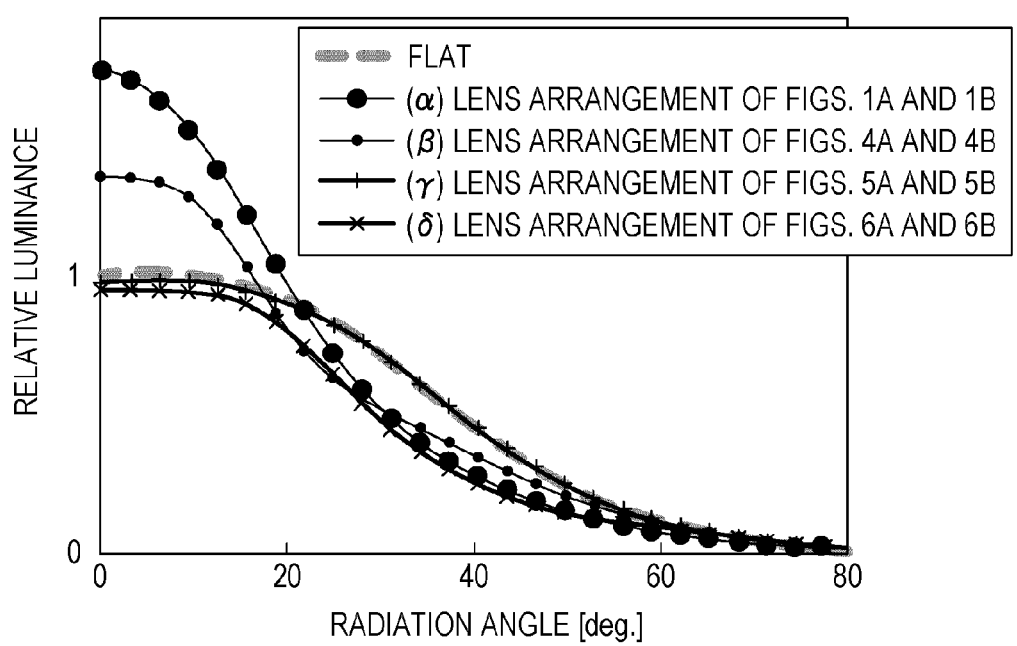
FIG. 7 is a graph showing the effect of the lens array in an organic EL display apparatus according to the present invention.

FIG. 7 is a graph showing the correlation between the radiation angle and the relative luminance in the lens arrangements shown in FIGS. 1A and 1B, FIGS. 4A and 4B, FIGS. 5A and 5B, and FIGS. 6A and 6B. (α), (β), (γ), and (δ) indicate the lens arrangements of FIGS. 1A and 1B, FIGS. 4A and 4B, FIGS. 5A and 5B, and FIGS. 6A and 6B, respectively. The FLAT curve represents the radiation angle and the relative luminance in the EL device shown in FIG. 2. As is evident from FIG. 7, the relative luminance in the front direction (radiation angle 0 deg.) in each of (α) and (β) is larger than the relative luminance in the case of the flat portion only, and in the wide radiation angle range, the intensity is reversed, thus exhibiting the light-condensing effect of a lens. In (α, line with large solid circles), the size of the lens is large and the lens portion outside the light-emitting region is wide compared with (β, line with small solid circles). Therefore, in (α), the light-condensing performance is high, and the relative luminance in the front direction (radiation angle 0 deg.) is high. In contrast, the relative luminance in the front direction (radiation angle 0 deg.) in each of (γ) and (δ) is substantially the same as that in the case of the flat portion only, and the light-condensing effect obtained is low. Accordingly, in order to obtain a satisfactory light-condensing effect, it is necessary that the light-condensing lens portion 16a is located in part of the region of the organic EL device, and at least part of the light-condensing lens portion 16a is located outside the pixel region. That is, in the case where the lens array according to the present invention is provided, it is possible to obtain a satisfactory light-condensing effect. It is to be noted that FIGS. 1A and 1B and FIGS. 4A and 4B show the examples of the embodiment, and the embodiment is not limited thereto.

Figure 8:
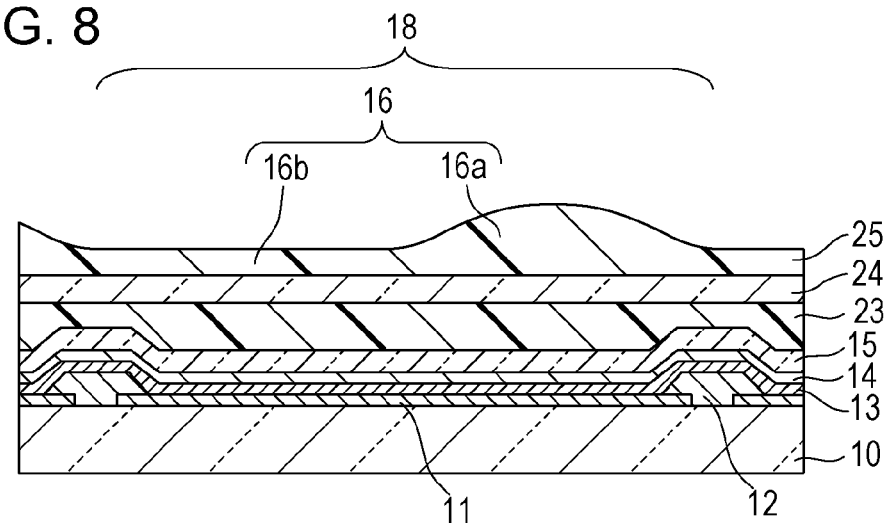
FIG. 8 is a cross-sectional schematic view showing a structure of a pixel in an organic EL display apparatus according to another embodiment of the present invention.

Furthermore, in the present invention, in order to improve the sealing performance, a sealing layer including an inorganic material layer and a resin layer may be provided. Such a sealing layer may be provided between the lens array and the organic EL devices, or the lens array may be provided on the resin layer inside the sealing layer. Specifically, the sealing layer can have a three-layered structure of inorganic material layer/resin layer/inorganic material layer. For example, FIG. 8 shows an example in which a protective film 15 serving as a first inorganic material layer, a resin layer 23, and a second inorganic material layer 24 are disposed in that order on a second electrode 14 on the light-emitting surface side of an organic EL device, and a lens array 16 is formed thereon. As the second inorganic material layer 24, a material having a high light transmittance and excellent moisture prevention can be used, and a silicon nitride film or a silicon oxynitride film can be used. The first protective film 15 and the second protective layer 24 may be composed of the same material or different materials. By omitting the protective film 15, a two-layered structure of resin layer 23/inorganic material layer 24 may also be employed. In order to provide satisfactory sealing performance, the thickness of the inorganic material layer 24 is set at 1 μm or more. The minimum thickness of the resin layer 23 is preferably 1 to 50 μm. If the minimum thickness is too small, foreign substances present in the fabrication process before forming the resin layer 25 cannot be covered, through-opening portions are formed in the inorganic material layer 24, and moisture resistance is decreased, resulting in dark spots. If the minimum thickness is too large, light attenuation may occur.

Figure 9:
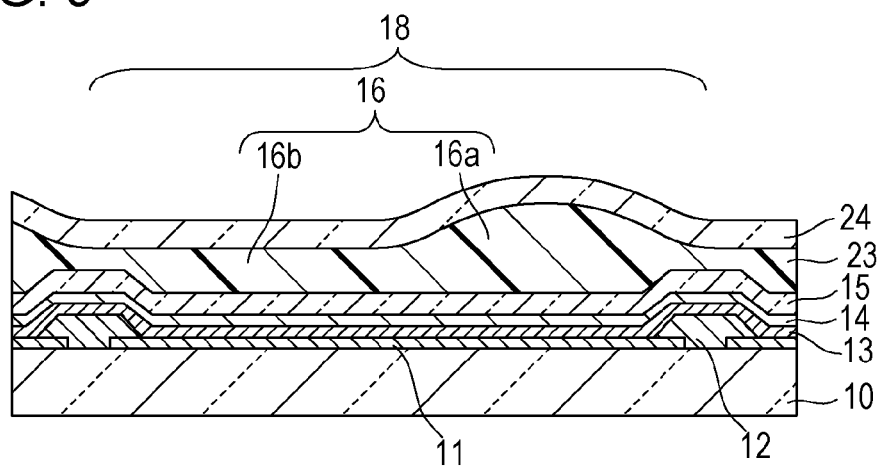
FIG. 9 is a cross-sectional schematic view showing a structure of a pixel in an organic EL display apparatus according to another embodiment of the present invention.

Furthermore, in order to suppress changes in the lens performance of the lens array (e.g., changes in focal length due to changes in refractive index and shape because of swelling caused by entry of water), a protective layer may be formed on the lens array shown in FIG. 8. The protective layer is composed of a silicon nitride film, a silicon oxynitride film, or the like. However, in order to prevent an increase in the number of layers and complexity, as shown in FIG. 9, a lens array may be formed in a resin layer 23 constituting a sealing layer, and the resin layer 23 may be protected by an inorganic material layer 24. Thereby, the number of process steps can be reduced, and it is possible to maintain light emission efficiency without emission losses due to reflections at layer interfaces. That is, a protective film 15 composed of a first inorganic material, a lens array 16 composed of a resin material, and an inorganic material layer 24 composed of a second inorganic material which follows the shape of the lens array 16 are disposed in that order on the second electrode 14 of the organic EL device. In such a structure, by using a material having moisture proofness for the inorganic material layer 24, degradation in lens performance can be prevented. The minimum thickness of the resin layer 23 is set at 1 to 50 μm. If the minimum thickness is too small, there may be a case where foreign substances present before forming the resin layer 23 cannot be covered, through-opening portions are formed in the inorganic material layer 24, and moisture resistance is decreased, resulting in dark spots. If the minimum thickness is too large, light attenuation may occur, or light emitted from a pixel may be emitted to the outside through an adjacent lens.

Figure 10:
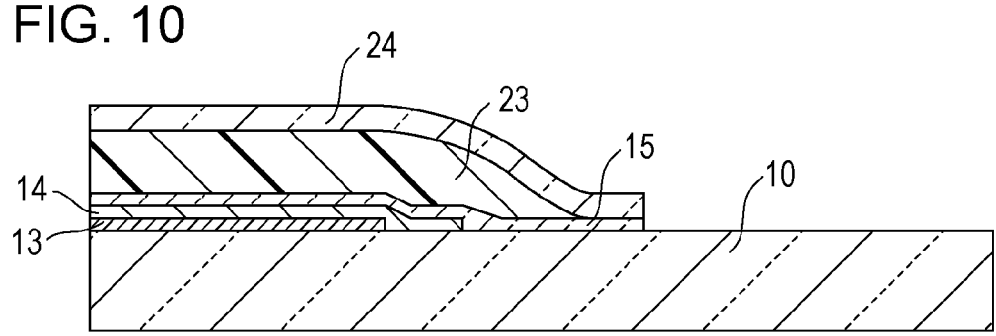
FIG. 10 is a cross-sectional schematic view showing part of the organic EL display apparatus according to the embodiment of the present invention shown in FIG. 9.

In the structure shown in FIG. 9, the protective film 15 which is the first inorganic material layer and the inorganic material layer 24 can enclose the resin layer 23 constituting the lens array 16 outside a display region as shown in FIG. 10. In such a manner, the lens array 16 is sealed by the protective film 15 and the inorganic material layer 24. The term "display region" refers to a region where the organic EL devices are arranged in the in-plane direction of the substrate. Here, the spaces between the organic EL devices are also included in the display region. As described above, the lens array 16 formed in the sealing layers (the protective film 15, the resin layer 23, and the inorganic material layer 24) is sealed by the protective film 15 (from below) and the inorganic material layer 24 (from above), and the lens array 16 does not come into contact with the external environment. Therefore, oxygen and water do not enter the lens array 16.

As a result, the sealing performance improves, and the organic EL devices can be prevented from being degraded. Since phenomena such as swelling of the lens array 16 do not occur, changes in focal length due to changes in refractive index and shape of the lens can be prevented, and there is no change in the function of the light-condensing lenses.

A method of manufacturing an organic EL display apparatus according to the present invention will now be described with reference to FIGS. 11A to 11D. FIGS. 11A to 11D are cross-sectional schematic views showing the steps of manufacturing an organic EL display apparatus shown in FIG. 1.

Figure 11A:
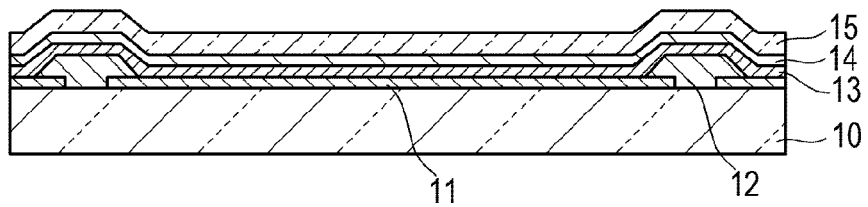
FIGS. 11A to 11D are cross-sectional schematic views showing the steps of manufacturing an organic EL display apparatus according to an example of the present invention.
Figure 11B:
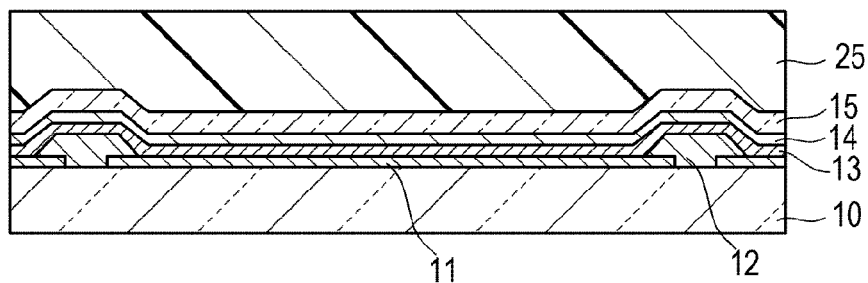

First, as shown in FIG. 11A, top-emission type organic EL devices are prepared. Next, as shown in FIG. 11B, a resin layer 25, which is a material for forming a lens array, is applied, with a thickness of about 10 to 100 μm, onto the protective film 15. As the resin layer 25, a thermosetting resin, a thermoplastic resin, or a photocurable resin can be used. When a thermosetting resin or a photocurable resin is used, application is performed by a spin coating method, a dispensing method, or the like. When a thermoplastic resin is used, a method may be employed in which a thermoplastic resin film is attached under vacuum. Examples of the resin suitable for forming the resin layer 25 include epoxy resins and butyl resins.

Figure 11C:
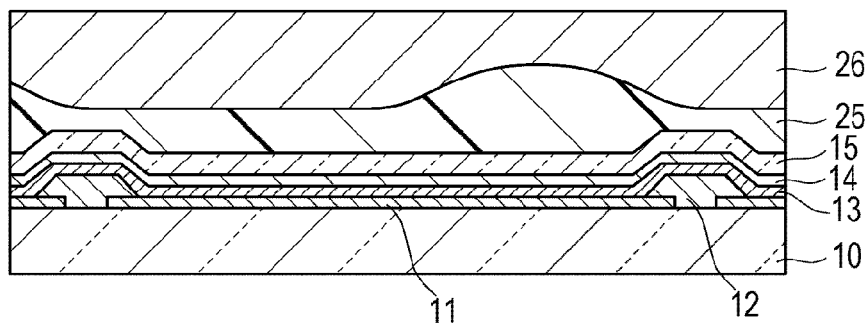

Next, as shown in FIG. 11C, a mold 26 for forming a lens array is prepared, and the mold 26 is brought into close contact with the resin layer 25 such that bubbles are not formed in the resin layer 25. The mold 26 can be composed of a commonly used metal. When a photocurable resin is used for the resin layer 25, a quartz substrate that can transmit light is suitably used. Furthermore, by forming a film of a fluorocarbon resin or the like on the surface of the mode 26, the detachability of the mold 26 from the resin layer 25 can be improved.

When a thermosetting resin is used for the resin layer 25, the resin is cured by heating at 80° C. while making an alignment such that the center of gravity of each of the lenses in the mold 26 is aligned with the center of the corresponding pixel. The curing temperature is preferably about 80° C. because the heat-resistant temperature of a commonly used organic EL device is about 100° C.

Figure 11D:
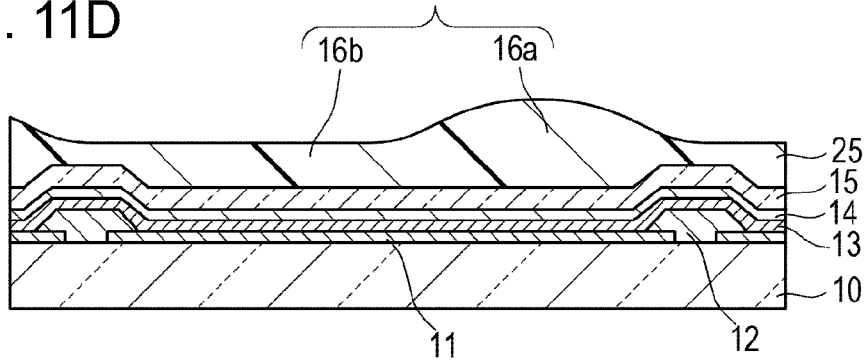

Next, as shown in FIG. 11D, the mold 26 is detached from the cured resin layer 25 (i.e., the lens array 16). In this process, if a film of a fluorocarbon resin or the like, which has an effect of reducing wettability, is formed on the surface of the mold 26, detachment can be easily performed.

The height of the lens array 16 can be changed to be substantially equal to the pixel pitch with good controllability. In the case where spherical lenses are formed, the height is set up to half the pixel pitch. In the steps of forming the lens array 16 shown in FIGS. 11B to 11D, a direct formation method using the mold 26 has been described. Besides the direct formation method, the lens array 16 can be formed by any of the following methods:

i) a method in which, after patterning by photolithography or the like, heat treatment is performed to form lenses by reflowing;

ii) a method in which the exposure amount during patterning such as photolithography is controlled with a gradient in an in-plane direction so as to have a lens shape directly after patterning;

iii) a method in which the shape is formed directly using ion beams, electron beams, or laser beams;

iv) a method in which an appropriate amount of resin is dripped on each aperture region to form a lens shape in a self-alignment manner; and v) a method in which lenses are formed on a thin resin sheet in advance, and the resin sheet provided with lenses is attached to a panel such that pixels are aligned with the lens positions.

Usually, the substrate 10 is provided with driving electronics, such as transistors, gates or the like and wiring; and for the purpose of protection, an interlayer insulating layer and a planarizing film are formed so as to cover the transistors and wiring. In the present invention, the protective film 15 may be in contact with an interlayer insulating layer formed in the substrate 10 outside the display region. That is, the protective film 15 and the protective layer formed on the substrate are used to seal the planarizing film, the first electrode 11, the partition 12, the organic compound layer 13, and the second electrode 14 disposed on the interlayer insulating layer of the substrate. The interlayer insulating layer has holes (vias) for enabling connection to the driving electronics (transistors) and wiring disposed thereunder. However, since the interlayer insulating layer is composed of an inorganic material, high moisture resistance is exhibited. The interlayer insulating layer can be composed of a material having excellent moisture proofness, and specifically can be a silicon nitride film or a silicon oxynitride film. Since the interlayer insulating layer has very few portions that are directly in contact with external air, silicon oxide may be used. Furthermore, the planarizing film is composed of a polyimide resin.

The display apparatus of the present invention can be used in mobile applications in which improvement in visibility due to high luminance is important, such as for rear monitors of digital cameras and mobile phones. Furthermore, since low power consumption is expected at the same luminance, in mobile applications, the replacement interval for batteries or the like can be extended.

EXAMPLES

Example 1

An organic EL display apparatus having the structure shown in FIGS. 1A and 1B was fabricated in accordance with the steps shown in FIGS. 11A to 11D.

First, a TFT driving circuit (not shown) composed of low-temperature polysilicon was formed on a glass substrate 10, and a planarizing film (not shown) composed of an acrylic resin was formed thereon to prepare a substrate.

An ITO layer with a thickness of 38 nm and an AlNd layer with a thickness of 100 nm were formed by sputtering in that order on the substrate. Subsequently, the ITO/AlNd layer was patterned for each pixel to form a first electrode 11. Furthermore, a partition 12 was formed using an acrylic resin. The pitch of pixels was 30 μm, and the size of the exposed portion of the first electrode 11 was 10 μm. The substrate was subjected to ultrasonic cleaning with isopropyl alcohol (IPA), and then to boil cleaning, followed by drying. Furthermore, UV/ozone cleaning was performed, and an organic compound layer 13 was formed by vacuum vapor deposition. First, a hole transport layer was formed, using HT-1 (FL03) having the structure shown below, commonly to all the pixels with a thickness of 87 nm. The degree of vacuum was $1 \times 10^{-4}$ Pa, and the vapor deposition rate was 0.2 nm/sec.

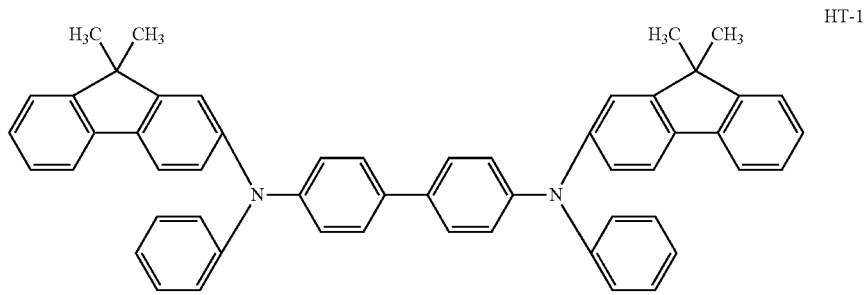 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

HT-1

Next, using shadow masks, a red light-emitting layer, a green light-emitting layer, and a blue light-emitting layer were formed with a thickness of 30 nm, 40 nm, and 25 nm, respectively. In the red light-emitting layer, CBP was used as a host, and 9% by mass of $Ir(piq)_3$ was added thereto. In the green light-emitting layer, $Alq_3$ was used as a host, and 1% by mass of coumarin 6 was added thereto. In the blue light-emitting layer, BAlq was used as a host, and 3% by mass of perylene was added thereto. Subsequently, bathophenanthroline (Bphen) was deposited by vacuum vapor deposition with a thickness of 10 nm as an electron transport layer common to all the pixels. The degree of vacuum during vapor deposition was $1\times10^{-4}$ Pa, and the deposition rate was 0.2 nm/sec. Then, Bphen and $Cs_2CO_3$ were co-vapor-deposited (90:10 by mass ratio) with a thickness of 40 nm as a common electron injection layer. The degree of vacuum during vapor deposition was $3\times10^{-4}$ Pa, and the deposition rate was 0.2 nm/sec. The substrate on which the layers up to the electron injection layer had been deposited was transferred to a sputtering system while maintaining the vacuum. As a second electrode 14, ultrathin Ag was deposited with a thickness of 10 nm and an IZO transparent electrode with a thickness of 50 nm was deposited. Next, a protective film 15 composed of silicon nitride was formed by plasma CVD using $SiH_4$ gas, $N_2$ gas, and $H_2$ gas (refer to FIG. 11A).

Subsequently, in a nitrogen atmosphere with a dew point of 60° C., a thermosetting resin layer 25 (epoxy resin) with a viscosity of 3,000 mPa·s was formed by application using a dispenser (SHOT MINI SL manufactured by Musashi Engineering, Inc.) that can perform precise drawing (refer to FIG. 11B).

Before the resin layer 25 was cured by heating, a mold 26 for forming a lens array, which was separately prepared, was pressed against the surface of the resin layer 25 (refer to FIG. 11C). At the time of pressing, positioning was performed by aligning an alignment mark formed on the mold 26 with an alignment mark formed on the substrate. Thereby, a lens array 16 was formed such that flat portions correspond to pixels. In the mold 26, concave portions or flat portions were formed at the same pitch as that of the pixels, and the surfaces of the concave portions were coated with a Teflon (registered trademark) resin as a mold release agent. The shape of the concave portion, that is, the shape of the light-condensing lens portion 16a in the lens array 16, had a radius of curvature of 30 μm. Since the pixel pitch was 30 μm, the height of the lens array 16 was about 4 μm with respect to the flat portion 16b (refer to FIG. 11D).

In the organic EL display apparatus of this example, when the luminance was compared with that of the example shown in FIG. 2 in which no condensing lens portion 16a was formed, in the case where light was condensed by a lens with a semicylindrical cross section, the luminance improved by about 1.3 to 1.5 times when viewed directly from the front. In the case where the shape of the upper surface of the aperture (light-emitting region) of the organic EL device was set to be square-shaped, circular, hexagonal, or the like, the light-condensing lens portion 16a could be spherical. In this case, since light could be condensed in all directions, the luminance improved by about twice when viewed directly from the front. These magnifications depend on the lens shape, the thickness of the flat portion, the aperture ratio of the light-emitting region, and the like, and therefore, the present invention is not limited to the numerical values described above.

FIG. 1B is a top schematic view of the organic EL display apparatus in this example. In FIG. 1B, 91Ra, 91Ga, and 91Ba denote regions corresponding to light-condensing lens portions 16a of light-emitting regions of organic EL devices emitting R, G, and B color light, respectively, and 91Rb, 91Gb, and 91Bb denote regions corresponding to flat portions.

Example 2

In order to improve the sealing performance, an organic EL display apparatus was fabricated as in Example 1 except that, as shown in FIG. 8, a resin layer 23 and an inorganic material layer 24 were further formed on the protective film 15, and a lens array 16 was formed in a resin layer 25 provided thereon.

In this example, layers up to the protective film 15 were formed as in Example 1. Then, in a nitrogen atmosphere with a dew point of 60° C., a thermosetting epoxy resin with a viscosity of 3,000 mPa·s was applied using a dispenser (SHOT MINI SL manufactured by Musashi Engineering, Inc.) that can perform precise drawing. Subsequently, under a vacuum environment, the epoxy resin was cured by heating at a temperature of 100° C. for 15 minutes to form a resin layer 23. The thickness of the resin layer 23 was set at 10 μm such that foreign substances and the like, if any, could be buried in consideration of the clean room and processing apparatus environment. Next, an inorganic material layer 24 composed of silicon nitride was formed by plasma CVD using $SiH_4$ gas, $N_2$ gas, and $H_2$ gas. The inorganic material layer 24 was formed with a thickness of 1 μm so as to cover the entire surface of the substrate provided with the organic EL devices.

Example 3

In order to prevent degradation of the lens performance while improving the sealing performance, as shown in FIG. 9, a resin layer 23 and an inorganic material layer 24 were formed on the protective film 15, and a lens array 16 was formed in the resin layer 23.

In this example, layers up to the protective film 15 were formed as in Example 1. Then, in a nitrogen atmosphere with a dew point of 60° C., a thermosetting epoxy resin with a viscosity of 3,000 mPa·s was applied using a dispenser (SHOT MINI SL manufactured by Musashi Engineering, Inc.) that can perform precise drawing. Before the epoxy resin was cured by heating, a mold for forming a lens array 16, which was separately prepared, was pressed against the surface of the applied epoxy resin. At the time of pressing, positioning was performed by aligning an alignment mark formed on the mold with an alignment mark formed on the substrate. Thereby, the lens array 16 including a light-condensing lens portion 16a and a flat portion 16b for each pixel was formed. Lastly, an inorganic material layer 24 composed of silicon nitride was formed by plasma CVD using $SiH_4$ gas, $N_2$ gas, and $H_2$ gas. The inorganic material layer 24 was formed with a thickness of 1 μm so as to cover the entire surface of the substrate provided with the organic EL devices.

In this example, since the microlens array 16 was completely covered with the protective film 15 and the inorganic material layer 24, even in a high-temperature, high-moisture environment, water did not permeate the resin layer 23, and swelling did not occur in the resin layer 23, resulting in no change in the light-condensing performance of lenses.

Example 4

An organic EL display apparatus was fabricated as in Example 1 except that a lens array 16 to be formed on a resin layer 25 was formed by patterning shown in FIGS. 12A to 12E.

Figure 12A:
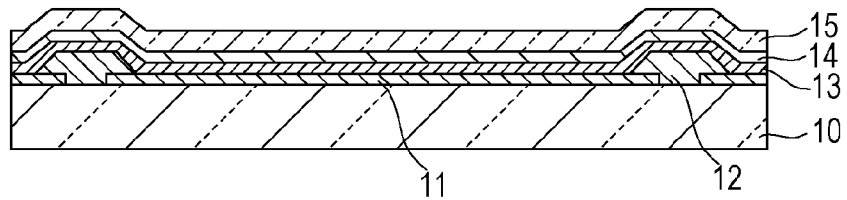
FIGS. 12A to 12E are cross-sectional schematic views showing the steps of manufacturing an organic EL display apparatus according to another example of the present invention.
Figure 12B:
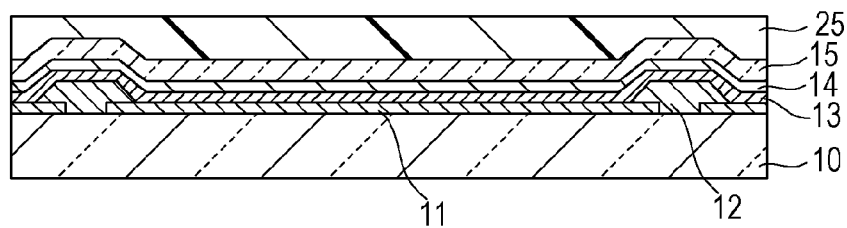
Figure 12C:
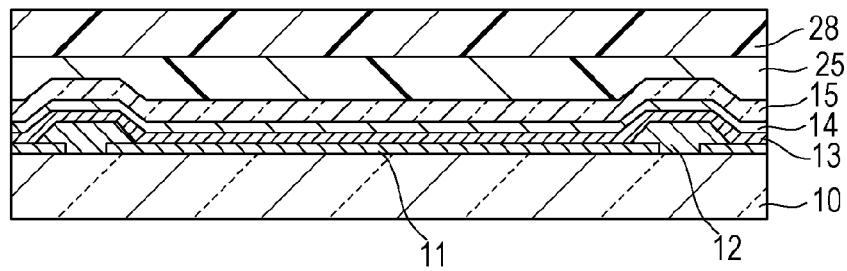
Figure 12D:
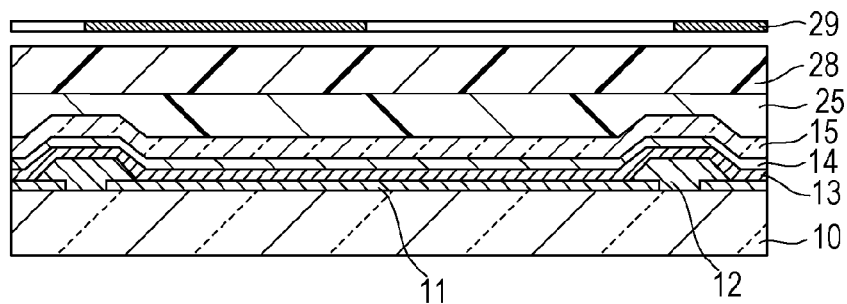
Figure 12E:
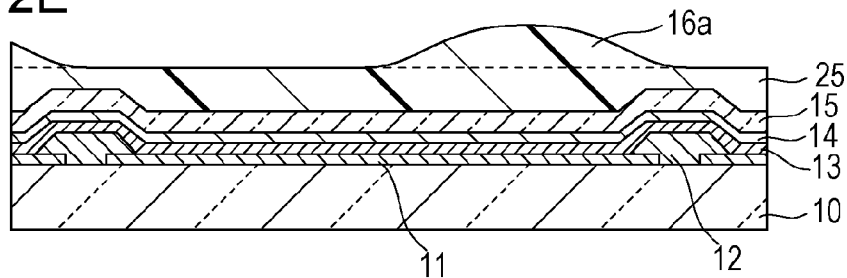

In this example, as shown in FIG. 12A, layers up to the protective film 15 were formed as in Example 1. Then, as shown in FIG. 12B, in a nitrogen atmosphere with a dew point of 60° C., a thermosetting epoxy resin with a viscosity of 3,000 mPa·s was applied with a thickness of 10 μm using a dispenser (SHOT MINI SL manufactured by Musashi Engineering, Inc.) that can perform precise drawing. Under a vacuum environment, the epoxy resin was cured by heating at a temperature of 100° C. for 15 minutes to form a resin layer 25. Subsequently, as shown in FIG. 12C, an epoxy resin 28, the same as the epoxy resin used for the resin layer 25, was applied onto the resin layer 25, and as shown in FIG. 12D, exposure was performed through a photomask 29. The exposure amount was set so as to have a two-dimensional distribution calculated from the shape of a light-condensing lens portion 16a shown in FIG. 12E. After development, the shape of the light-condensing lens portion 16a was obtained. The control of the exposure amount in an in-plane direction was performed by controlling the transmittance of the photomask 29 in the in-plane direction. Then, the resin was cured by heating at a temperature of 100° C. for 15 minutes under a vacuum environment again. This heat treatment also served to smoothen the surface of the lens array. The thickness of the thinnest portion of the resin layer 25 was set at 10 μm such that foreign substances and the like, if any, could be buried by the resin layer 25. The lens array shown in FIG. 12E substantially includes light-condensing lens portions 16a only, and does not include flat portions. It may also be possible to form flat portions in the resin layer 28.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-178320 filed Aug. 9, 2010 and No. 2011-136084 filed Jun. 20, 2011, which are hereby incorporated by reference herein in their entirety.

What is claimed is:

1. An organic electroluminescence display apparatus comprising:
    a plurality of organic electroluminescence devices disposed on a substrate; and
    a lens array which includes a light-condensing lens portion for each organic electroluminescence device,
    wherein a region in which the light-condensing lens portion is disposed and a region in which the light-condensing lens portion is not disposed are located on a light-emitting region of each organic electroluminescence device; and
    wherein a top surface of the light-condensing lens portion overlies the light-emitting region, and a part of the light-condensing lens portion is located outside the light-emitting region.

2. The organic electroluminescence display apparatus according to claim 1, further comprising a sealing layer provided between the lens array and the organic electroluminescence devices, the sealing layer including an inorganic material layer and a resin layer.

3. The organic electroluminescence display apparatus according to claim 1, further comprising a sealing layer provided on a light-emitting surface side of the organic electroluminescence devices, the sealing layer including an inorganic material layer and a resin layer, wherein the lens array is disposed on the resin layer.

4. The organic electroluminescence display apparatus according to claim 2, wherein the sealing layer includes a three-layered structure including a first inorganic material layer, a resin layer, and a second inorganic material layer stacked upon each other in that order.

5. The organic electroluminescence display apparatus according to claim 4, wherein the two inorganic material layers constituting the sealing layer are in contact with each other outside a display region of the display apparatus to seal the resin layer.

6. The organic electroluminescence display apparatus according to claim 2, wherein the minimum thickness of the resin layer is 1 to 50 μm.

7. The organic electroluminescence display apparatus according to claim 2, wherein the substrate is provided with driving electronics configured to drive the organic electroluminescence devices, wiring, and an interlayer insulating layer which covers and protects the driving electronics and the wiring; and
    wherein the interlayer insulating layer and the inorganic material layer constituting the sealing layer are in contact with each other outside a display region of the display apparatus to seal the plurality of organic electroluminescence devices.

8. The organic electroluminescence display apparatus according to claim 1, wherein the part of the light-condensing lens portion is an outer periphery of the light-condensing lens portions.

\* \* \* \* \*